(12) United States Patent
Hitz

(10) Patent No.: US 11,897,124 B2
(45) Date of Patent: Feb. 13, 2024

(54) METHOD FOR MONITORING A SUPPLY SYSTEM OF A ROBOT

(71) Applicant: BIZLINK ROBOTIC SOLUTIONS GERMANY GMBH, Schmalkalden (DE)

(72) Inventor: Bastian Hitz, Postbauer-Heng (DE)

(73) Assignee: LEONI Protec Cable Systems GmbH, Schmalkalden (DE)

( * ) Notice: Subject to any disclaimer, the term of this patent is extended or adjusted under 35 U.S.C. 154(b) by 715 days.

(21) Appl. No.: 16/982,672

(22) PCT Filed: Mar. 18, 2019

(86) PCT No.: PCT/DE2019/100244
§ 371 (c)(1),
(2) Date: Sep. 21, 2020

(87) PCT Pub. No.: WO2019/179566
PCT Pub. Date: Sep. 26, 2019

(65) Prior Publication Data
US 2021/0001499 A1 Jan. 7, 2021

(30) Foreign Application Priority Data
Mar. 19, 2018 (DE) .......................... 102018204184.9

(51) Int. Cl.
*B25J 19/00* (2006.01)
*B25J 9/16* (2006.01)
(Continued)

(52) U.S. Cl.
CPC ......... *B25J 19/0029* (2013.01); *B25J 9/1674* (2013.01); *B25J 9/1694* (2013.01);
(Continued)

(58) Field of Classification Search
CPC .... B25J 19/0029; B25J 9/1674; B25J 9/1694; B25J 13/087; B25J 19/0025; B25J 19/06; B25J 19/02; G01R 31/11; G01R 31/58
(Continued)

(56) References Cited

U.S. PATENT DOCUMENTS

| 5,483,603 A | 1/1996 | Luke et al. |
| 6,853,196 B1 | 2/2005 | Barnum et al. |

(Continued)

FOREIGN PATENT DOCUMENTS

| CN | 101046501 A | 10/2007 |
| CN | 101975914 A | 2/2011 |

(Continued)

*Primary Examiner* — Tung X Nguyen
*Assistant Examiner* — Robert P Alejnikov, Jr.
(74) *Attorney, Agent, or Firm* — Laurence A. Greenberg; Werner H. Stemer; Ralph E. Locher

(57) ABSTRACT

A method monitors a supply system of a robot having a robot arm and a robot hand movable relative thereto. The supply system has a supply chain, in particular a cable assembly, and a guide for the supply chain. The supply chain is guided along the robot arm in order to supply the robot hand. The supply system also has a number of sensors for monitoring at least one state variable of the supply system. The functional capability of the supply system is concluded, inferred or predicted from values for the state variable that are determined by the sensors.

18 Claims, 1 Drawing Sheet

(51) Int. Cl.
  *B25J 13/08*   (2006.01)
  *G01R 31/11*   (2006.01)

(52) U.S. Cl.
  CPC ............. *B25J 13/087* (2013.01); *G01R 31/11* (2013.01); *B25J 19/0025* (2013.01)

(58) Field of Classification Search
  USPC ........................................................ 324/534
  See application file for complete search history.

(56) References Cited

U.S. PATENT DOCUMENTS

| | | | |
|---|---|---|---|
| 7,810,765 B2 * | 10/2010 | Burlot | H02G 3/0481 |
| | | | 248/75 |
| 10,121,572 B2 | 11/2018 | Koeppendoerfer | |
| 10,352,683 B2 | 7/2019 | Ouellette | |
| 2004/0260481 A1 * | 12/2004 | Heiligensetzer | B25J 9/1674 |
| | | | 702/33 |
| 2011/0037483 A1 * | 2/2011 | Scheuermann | G01L 1/14 |
| | | | 324/644 |
| 2013/0154676 A1 * | 6/2013 | Wu | G01N 3/08 |
| | | | 324/750.01 |
| 2015/0251240 A1 | 9/2015 | LeMieux | |
| 2015/0328780 A1 | 11/2015 | Burlot | |
| 2019/0107574 A1 | 4/2019 | Koeppendoerfer et al. | |
| 2019/0120706 A1 * | 4/2019 | Janssen | G01R 31/58 |
| 2019/0178735 A1 * | 6/2019 | Köppendörfer | G01L 3/22 |
| 2019/0271732 A1 | 9/2019 | Janssen et al. | |

FOREIGN PATENT DOCUMENTS

| | | | | |
|---|---|---|---|---|
| CN | 103384585 A | * | 11/2013 | ............ B25J 13/087 |
| CN | 103840432 A | | 6/2014 | |
| CN | 104697432 A | | 6/2015 | |
| CN | 106042004 A | | 10/2016 | |
| CN | 107112092 A | | 8/2017 | |
| CN | 107516641 A | | 12/2017 | |
| CN | 206811974 U | | 12/2017 | |
| DE | 202005005869 U1 | | 8/2005 | |
| DE | 102004018213 A1 | | 11/2005 | |
| DE | 202013105036 U1 | * | 3/2015 | ............ B25J 13/085 |
| DE | 102016203552 A1 | | 9/2017 | |
| DE | 102016210601 A1 | | 12/2017 | |
| DE | 102016210615 A1 | | 12/2017 | |
| DE | 102018204171 A1 | | 9/2019 | |
| DE | 102018204173 A1 | | 9/2019 | |
| DE | 102018204184 A1 | * | 9/2019 | ............ B25J 13/087 |
| EP | 2956277 B1 | | 9/2017 | |
| JP | 2017226000 A | | 12/2017 | |
| KR | 200418443 Y1 | | 6/2006 | |
| KR | 20150104451 A | | 9/2015 | |
| KR | 20160141803 A | | 12/2016 | |
| WO | 2012061979 A1 | | 5/2012 | |
| WO | 2018086949 A1 | | 5/2018 | |

* cited by examiner

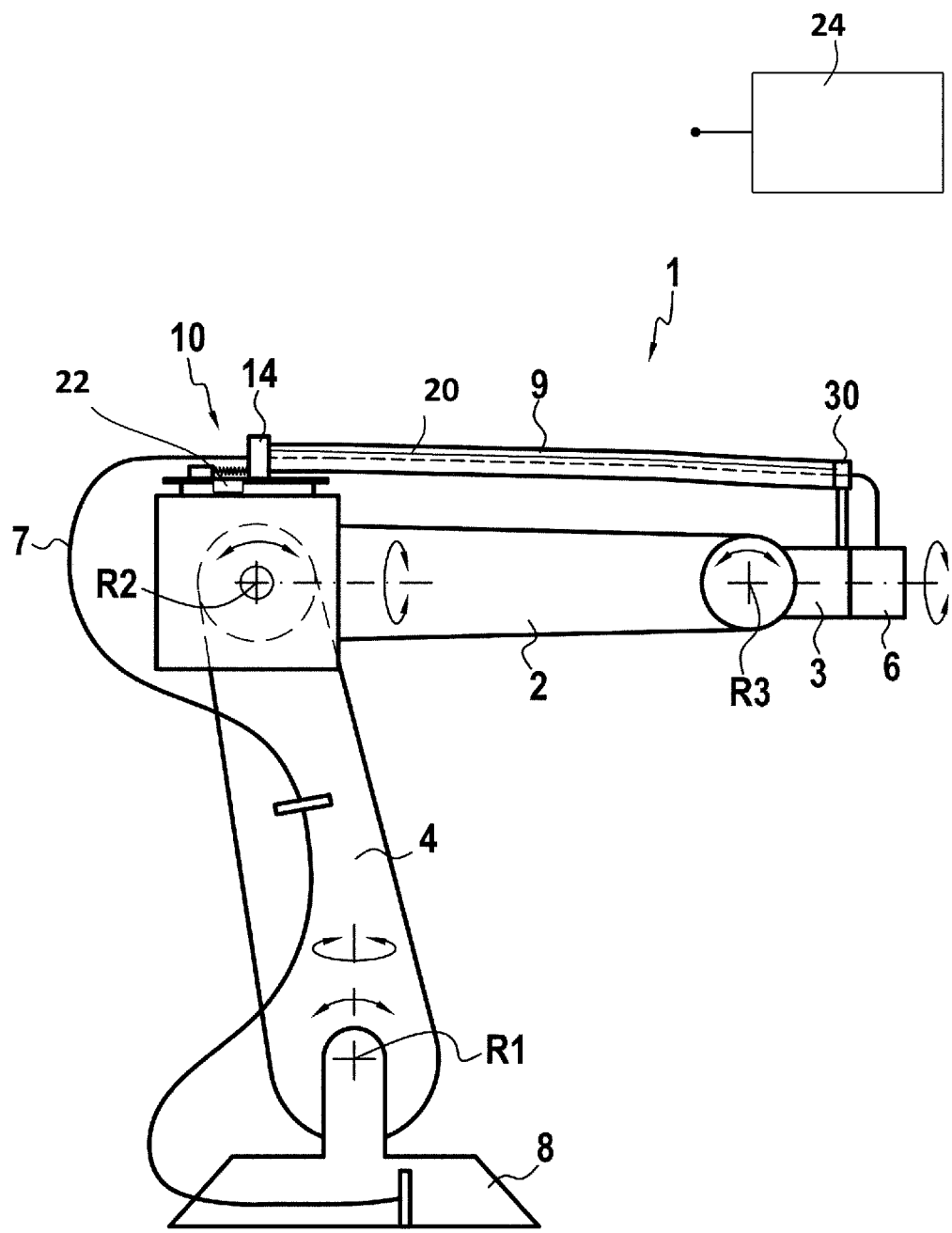

METHOD FOR MONITORING A SUPPLY SYSTEM OF A ROBOT

BACKGROUND OF THE INVENTION

Field of the Invention

The invention relates to a method for monitoring a supply system of a robot that has a robot arm and a robot hand able to move with respect thereto, wherein the supply system has a supply cable, in particular a cable assembly, and a guide for the supply cable that is guided along the robot arm in order to supply the robot hand.

Due to the relative movement between the robot arm and the robot hand, the supply cable is guided such that compensation movements are permitted. The numerous movements exert different mechanical loads during a respective operating cycle.

One example of a device for guiding a cable assembly along a robot is disclosed for example in EP 2 956 277 B1.

In addition to mechanical loads, the cable assembly is furthermore also exposed to other loads, for example thermal loads or the influences of media. Due to the many different types of loads, the cable assembly is typically a wearable part that is regularly replaced.

SUMMARY OF THE INVENTION

On the basis of this, the invention is based on the object of increasing the reliability of such a cable assembly and the usage time thereof until it needs to be replaced.

The object is achieved according to the invention by a method having the features of described below. Preferred refinements are contained in the dependent claims.

In the method, a number of sensors for monitoring at least one state variable of the supply system are provided in order to monitor the supply system of a robot. The functionality of the supply system is concluded on the basis of the values, ascertained by the at least one sensor, for the respective state variable. A statement about a remaining service life is expediently made at the same time.

The particular advantage with this system is that active monitoring of the current state, in particular linked to a prediction about the remaining service life, is achieved by way of the sensors. The supply chain, in particular the cable assembly, is therefore no longer replaced at fixed maintenance intervals. The captured sensor data are in this case expediently stored and provided with a timestamp in order to track developments in the values of the state variables or else the properties of the cable assembly and to take them into consideration for the forecast. In this case, changes or the degree of the increase in changes are especially able to be ascertained for example through a comparison with earlier actual values. The sensor data are expediently recorded continuously during operation.

The sensor is in this case preferably integrated directly in the supply chain, especially in an electrical cable contained therein.

The sensor is in this case especially designed as a bend sensor that in particular records the bending of the cable assembly or of the supply chain during the compensation movements.

For the bend sensor integrated into the cable, use is made for example of a bend sensor as described in German application 10 2018 204 173.3 from Mar. 19, 2018 or as described in German application 10 2018 204 171.7 from Mar. 19, 2018 in the name of the applicant. Reference is made in full to these two German applications. The disclosure content thereof is hereby incorporated.

The cable itself is therefore designed as an intelligent cable that is used to monitor its own state and thus that of the supply chain.

The sensor expediently comprises a line element integrated in the cable. This line element is for example a strand or a pair of strands that is guided in the cable assembly. A sensor signal is fed into this line element by way of an appropriate infeed unit, and a response signal is evaluated by an evaluation unit. The infeed unit and evaluation unit are in this case typically arranged at the same point on the cable. The infeed unit is for example integrated into a plug of the cable or in a supply unit connected thereto. The evaluation unit itself may be integrated into the infeed unit or else be arranged remotely therefrom. In the latter case, the response signal, also referred to as reflected signal, is transmitted to the evaluation unit.

The response signal preferably arises due to a reflection at a "fault point" that is caused for example by a bend. The propagation of the sensor signal within the line element and the reflection of parts of the sensor signal depends on the dielectricity of the line element, which in turn is influenced by the state variables. Changed temperatures, bending radii and external pressures influence the reflected response signal that is evaluated in order to determine the respective value of the state variables.

In order to evaluate the response signals/reflected signal component, provision is made for example for a time-of-flight measurement, for example in the form of time domain reflectometry (TDR for short). In this case, a measurement pulse is fed into the sensor strands and the voltage profile of the reflected signal component or response signal is evaluated.

As an alternative to a TDR measurement, a measurement method by Applicant, which is described in International Publication WO 2018/086948, is used. The disclosure content thereof, in particular the claims thereof (with the associated explanations) are hereby incorporated expressly into the present application. Reference is made especially to the explanations, on pages 5/6 and 8/9. In this case, a plurality of individual measurements are performed in the course of a measurement cycle, wherein one measurement signal is fed into the sensor strands by the infeed unit per individual measurement, wherein a stop signal is generated when a predefined voltage threshold value (at the infeed location) is exceeded due to the reflected signal component, wherein a time of flight between the infeed of the measurement signal and the stop signal is ascertained, and wherein the voltage threshold value is changed between the individual measurements.

Precisely one stop signal is therefore generated at each individual measurement. There is no more extensive evaluation of the reflected signal. Due to the threshold value, which is changed between the individual measurements, different fault points, which thus lead to amplitudes of different magnitudes at the reflection, are in particular also recorded in a spatially resolved manner through the different times of flight.

The times of flight (stop signals) of the reflected components are therefore recorded by the multiplicity of individual measurements, generally at different defined threshold values. In this respect, this method may be considered to be a voltage-discrete time measurement method. The number of individual measurements is in this case preferably more than 10, more preferably more than 20 or even more than 50 and for example up to 100 or more individual measurements. A multiplicity of stop signals that are arranged in a temporally distributed manner are thus ascertained from the multiplicity of these individual measurements. The multiplicity of stop signals, in connection with the threshold values, therefore roughly represents the actual signal profile of the fed-in measurement signal and of the reflected components. The actual signal profile for a fed-in measurement signal reflected at the line end is expediently approximated from these stop signals, for example through a mathematical curve fit.

A respective individual measurement is preferably ended, due to the measurement principle according to the invention, as soon as a stop signal occurs. In order also to reliably check the line as to whether a plurality of identical fault points that each lead to a reflected component with a comparable signal amplitude are present, in one preferred refinement, following a first individual measurement, a measurement dead time during which the measurement arrangement is deactivated as it were and does not respond to a stop signal is predefined. There is especially provision in this case for a second individual measurement to be performed, following a first individual measurement and a recorded first stop signal, in which the same threshold value as in the first individual measurement is preferably set. The measurement dead time within which a stop signal is not recorded is in this case (slightly) greater than the time of flight, recorded in the first individual measurement, between the start and the stop signal. This avoids the reflected component, associated with the first stop signal, being recorded in the second individual measurement. This cycle is preferably repeated multiple times until no further stop signal is recorded. That is to say, the measurement dead time is in each case adjusted to the time of flight of the stop signal recorded in the previous individual measurement (first, second, third, etc.), that is to say selected to be slightly greater, until no further stop signal occurs at this set threshold value.

A signal profile is expediently measured by suitably setting the respective measurement dead time in combination with varying the threshold value. This in particular also records falling edges in the signal profile. Signal peaks with rising and with falling edges are therefore able to be recorded and evaluated.

The guide for the cable assembly generally has a compensation system with a movable guide element. A cable clip to which the cable assembly is fastened and that performs a compensation movement in relation to the robot arm is especially often provided. Such a guide element is typically movable counter to a spring force/return force, in particular mounted in a manner able to move on rails. The movement of the cable assembly is expediently then recorded and used to assess the functionality of the supply system, in particular of the cable assembly.

The acceleration of the cable assembly, the number of compensation movements, and/or the magnitude of the compensation movement are expediently recorded in this case as state variables. The respective current environmental conditions, such as for example temperature, vibrations, etc. are preferably additionally recorded and taken into consideration in parallel therewith. All of these state variables are therefore recorded continuously during operation and are incorporated into the assessment of the functionality and in particular when ascertaining the remaining service life.

The movement is in this case expediently recorded by way of an external sensor that is arranged in the guide. This external sensor may be an electrical sensor, an optical sensor, a proximity sensor or else a tensile sensor on a return mechanism for the compensation system.

An external sensor is generally preferably arranged in addition to the sensor integrated in the cable. Sensor data both from the sensor internal to the cable and from the external sensor are therefore taken into consideration and evaluated in order to conclude as to the current functionality of the supply system.

In one particularly expedient refinement, a measurement value obtained from the integrated sensor is in this case checked and verified on the basis of the measurement value from the external sensor. It is thus checked whether the data transmitted by the sensor internal to the cable are plausible. This comparison with an external sensor for example reduces false diagnoses by the sensor internal to the cable. By way of example, a bend sensor integrated in the cable sensor and the data therefrom are especially compared with the movement data from the external sensor, and it is checked whether the data are plausible.

In order to evaluate the obtained data and measurement values, in one preferred refinement, these are compared using a comparison system and a statement about the functionality is made on the basis of this comparison. Empirical values, for example in tabular form, are stored within the comparison system, such that current state information is able to be derived through the comparison using the comparison system.

As an alternative, the comparison system is a mathematical model that thus emulates the real system and mathematically describes it as a function of the variable state variables.

The comparison system is expediently integrated in an evaluation unit to which the measurement data are transmitted. This evaluation unit is integrated for example in the machine controller for the robot. As an alternative, however, it may also be contained in a superordinate control center or even in an organizational unit not belonging to the operator of the robot. By way of example, the data obtained from the sensors are transmitted to the manufacturer of the cable assembly, who thereby monitors the functionality of the supply system in the context of a service.

In one expedient refinement, the state variables in a multiplicity of supply systems are recorded and transmitted to this superordinate, common and thus central evaluation center and evaluation unit. The collected data are then used to modify the comparison system. This makes it possible to continuously optimize and further develop the comparison system in order to improve the statement accuracy.

In addition to the internal sensor and the external sensor, at least one further external data source, such as for example the machine controller of the robot, is itself furthermore preferably also used and taken into consideration in order to assess the functionality. It is likewise possible to derive movement data from said data source, for example on the basis of the control commands, and/or the measurement data from the sensors may be subjected to a plausibility check.

According to a further independent aspect, what is provided is a method for monitoring an electrical system, wherein the electrical system is a data and/or supply system in which at least two components are connected to one another via a cable system. This electrical system in turn has a number of sensors via which at least one and preferably a plurality of state variables of the electrical system and/or of the environment are recorded. The cable system in this case has a cable having a sensor integrated therein, and an additional external sensor is furthermore provided outside the cable system. A measurement value from this external sensor is then evaluated in addition to the sensor integrated in the cable in order to conclude as to the current functionality of the supply system.

As already explained above in connection with the robot, both an internal sensor and an external sensor are therefore used to check the functionality and also to predict the remaining service life. The external sensor is in this case in particular expediently used to validate and check the plausibility of the data transmitted by the internal sensor.

The electrical system that is generally claimed here is for example a (high-voltage) supply system of a motor vehicle, especially of a motor vehicle driven by an electric drive motor. The electrical system in this case consists for example of a battery, a cable and power electronics/a drive motor, wherein the battery is connected to the drive motor via the cable. As an alternative, the electrical system is a gangway connection system, for example in the case of rail-bound vehicles, but also in the case of trucks, etc. It may also be a charging system for electromobility purposes, in which the first component is a charging column and the second component is the battery.

Generally speaking, the statement quality about the monitoring system based on a sensor integrated in an integrated cable is improved by incorporating the signals and information from further external sensors.

BRIEF DESCRIPTION OF THE DRAWING

One exemplary embodiment of the invention is explained in more detail below with reference to the single FIGURE. This FIGURE shows a simplified illustration of a side view of an industrial robot.

DETAILED DESCRIPTION OF THE INVENTION

An articulated-arm robot is illustrated as robot in the FIGURE. This articulated-arm robot 1 is for example a multi-axis industrial robot, in particular a six-axis industrial robot. It has a base 8, a first segment, also called swing arm 4, that is connected to the base 8 via a first articulated connection R1. The swing arm 4 is able to be pivoted about this first articulated connection R1 about a horizontal axis. The swing arm 4 is also usually able to be pivoted about a vertical axis relative to the base 8. The swing arm 4 extends approximately upward in the vertical direction. A second segment, generally called robot arm 2, is connected to the swing arm 4 at a second articulated connection R2, so as to be able to pivot about what is known as an "axis 3". Finally, as third segment, a robot hand 3 is connected to the second segment 2 via a third articulated connection R3. A machine tool 6, such as for example welding tongs, etc., is finally attached to the robot hand 3. Such an industrial robot 1 has a total of six different degrees of freedom of movement.

In order to supply electricity and/or fluids and/or data signals to the machine tool 6, the industrial robot 1 has a supply chain, which is referred to hereinafter as supply line assembly 7. This is guided along the robot arm 2 and connected from there to the base 8. In the region of the robot arm 2, the supply line assembly 7 is guided in a protective cable, at least in one section. The supply line assembly 7, together with the protective cable, is hereinafter also called cable assembly 9. A disconnection point for the supply line assembly 7 is often arranged in the region of the second articulated connection, and the cable assembly 9 is guided to this disconnection point in the form of a replaceable wearable unit.

As may be seen in the figure, in the event of a rotational movement about the third articulated axis R3, a pulling movement is exerted on the cable assembly. In the case of the opposite movement back into the starting position according to the figure, the cable assembly has to be pulled back into the starting position.

To this end, a device 10 for guiding and for returning the cable assembly 9 is fastened on the robot arm 2 in the region of the second articulated connection R2. This is illustrated only in highly schematic form in the figure. A fastening clip 14 belongs to this device 10 and holds the cable assembly 9, in particular in a form-locking manner, such that a return force exerted by the device is transferred onto the cable assembly 9. The fastening clip 14 is in particular guided in a (longitudinally) displaceable manner counter to the spring force of a return spring. During operation, this therefore performs movements with the cable assembly.

The cable assembly 9 is additionally fixed via a further fastening clip 30 at its front end oriented toward the robot hand 3. The individual lines or the supply line assembly 7 emerges from the protective cable at these positions.

In order then to check the functionality of the supply line assembly and especially the cable assembly 9, the cable assembly 9 has an integrated line element 20 that forms an integrated sensor. This line element in this case extends in the direction of the cable assembly. This line element especially serves to record bending of the cable assembly 9. An external sensor 22 is furthermore additionally arranged, this being arranged especially in the region of the device 10 and in particular recording the movements of the compensation mechanics, for example the movement of the fastening clip 4. In this case, tensile forces, acceleration values, speed values, number of compensation movements, etc. are for example recorded. Both the data from the sensor 20 and those from the sensor 22 are transmitted to an evaluation unit 24 and evaluated there in order especially to conclude as to the functionality of the cable assembly. To this end, a comparison system, as a representation of the real system, is contained within the evaluation unit 24. The measurement data obtained from the two sensors 20, 22 are compared by way of the comparison system and current state information, and in particular additionally a prediction about the remaining service life, are obtained therefrom.

During operation, the relevant data, for example the movement data, are recorded continuously by way of the external sensor 22. These data are processed and provided with a timestamp. The data are then compared with further information, for example with that from the internal sensor 20 or else with further external information, for example from the machine controller, and correlated. Based on this correlation and analysis of the different signals from the different information sources, especially in the comparison using the comparison system, current state data containing the respective service life forecasts are output.

The evaluation unit may in this case be integrated in the machine controller or as an alternative be arranged remotely therefrom. The signals are for example transmitted wirelessly.

According to one embodiment variant, when recording the data, critical states that exceed for example a critical limit value are recorded and stored as impermissible states.

One advantage of the system described here is that it is also suitable for retrofitting in existing systems.

Especially in the context of a global approach, when a multiplicity of systems are used, the data are in this case recorded and evaluated jointly and used in the context of a learning approach to improve the evaluation, especially the comparison system. The for example (mathematical) model that forms the comparison system may thereby be improved continuously. In this case, more extensive fault notifications from the individual installed systems and the failures thereof may be taken into consideration. In addition to the superordinate central evaluation unit, an evaluation unit in which the comparison system is stored is expediently provided for each system. This may then be updated centrally.

The invention claimed is:

1. A method for monitoring a supply system of a robot having a robot arm and a robot hand movable relative to the robot arm, the method comprising:
providing the supply system with a supply chain and a guide for the supply chain;
guiding the supply chain along the robot arm for supplying the robot hand;
monitoring at least one state variable of the supply system by using a plurality sensors of the supply system; and
drawing conclusions as to a functionality of the supply system based on values for the state variable ascertained by the sensors.

2. The method according to claim 1, which further comprises providing a cable assembly as the supply chain.

3. The method according to claim 1, which further comprises providing the supply chain with an electrical cable and integrating one of the sensors in the electrical cable.

4. The method according to claim 3, which further comprises providing the one sensor as a bend sensor.

5. The method according to claim 3, which further comprises providing the one sensor as a line element of the electrical cable, feeding a sensor signal into the line element and evaluation a response signal of the line element.

6. The method according to claim 5, which further comprises:
performing a plurality of individual measurements in a course of a measurement cycle;
feeding a measurement signal into the line element per individual measurement;
generating a stop signal upon exceeding a predefined threshold value due to a reflected measurement signal component; and
ascertaining a time of flight between feeding in the measurement signal and generating the stop signal.

7. The method according to claim 6, which further comprises ending the individual measurements upon generating the stop signal, and changing the threshold value between the individual measurements.

8. The method according to claim 6, which further comprises:
performing a second individual measurement following a recording of a first stop signal in a first individual measurement; and
predefining a measurement dead time being greater than a time of flight recorded in the first individual measurement, for the first stop signal in the second individual measurement, to prevent a reflected component associated with the first stop signal from being recorded in the second individual measurement.

9. The method according to claim 8, which further comprises performing the second individual measurement with a threshold value being identical to a threshold value used in the first individual measurement.

10. The method according to claim 3, which further comprises providing another of the sensors as an external sensor disposed outside the electrical cable in addition to the one sensor integrated in the cable, and evaluating a measurement value from the external sensor in addition to a measurement value from the sensor integrated in the electrical cable to draw a conclusion as to a current functionality of the supply system.

11. The method according to claim 10, which further comprises using the measurement value from the external sensor to classify a measurement value obtained from the integrated sensor as correct or incorrect.

12. The method according to claim 10, which further comprises using a comparison system to compare the measurement values for the state variables, and making a statement about the functionality from the comparison.

13. The method according to claim 12, which further comprises recording the state variables of a multiplicity of supply systems, transmitting the state variables to a superordinate common central evaluation center, and using the state variables to modify the comparison system.

14. The method according to claim 1, which further comprises providing the guide with a compensation system connected to the supply chain, using the compensation system to record a movement of the supply chain and using the compensation system to assess the functionality of the supply system.

15. The method according to claim 14, which further comprises using the compensation system to record, selectively or in combination, an acceleration of the supply chain, a number of compensation movements or a magnitude of a deflection.

16. The method according to claim 14, which further comprises providing one of the sensors as an external sensor disposed in or on the guide, and using the external sensor to record the movement of the supply chain.

17. The method according to claim 1, which further comprises using at least one further data source, and taking the at least one further data source into consideration for an assessment of the functionality.

18. The method according to claim 17, which further comprises using a machine controller of the robot as the at least one further data source.

* * * * *